US012753526B2

(12) United States Patent
Pasayat et al.

(10) Patent No.: US 12,753,526 B2
(45) Date of Patent: Oct. 6, 2026

(54) # METAL ORGANIC CHEMICAL VAPOR DEPOSITION OF SEMI-INSULATING EXTRINSICALLY CARBON-DOPED GROUP III-NITRIDE FILMS

(71) Applicant: Wisconsin Alumni Research Foundation, Madison, WI (US)

(72) Inventors: Shubhra S. Pasayat, Middleton, WI (US); Chirag Gupta, Middleton, WI (US); Swarnav Mukhopadhyay, Madison, WI (US); Cheng Liu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 276 days.

(21) Appl. No.: 18/477,737

(22) Filed: Sep. 29, 2023

(65) Prior Publication Data

US 2025/0109524 A1 Apr. 3, 2025

(51) Int. Cl.
*C30B 29/40* (2006.01)
*C30B 25/16* (2006.01)
*C30B 25/18* (2006.01)

(52) U.S. Cl.
CPC .......... *C30B 25/165* (2013.01); *C30B 25/183* (2013.01); *C30B 29/406* (2013.01)

(58) Field of Classification Search
None
See application file for complete search history.

(56) References Cited

U.S. PATENT DOCUMENTS 8,421,190 B2 * 4/2013 Okahisa .................. C30B 25/02 438/510
9,245,992 B2 1/2016 Keller et al.
2010/0244101 A1 9/2010 Kokawa et al.
2016/0133737 A1 * 5/2016 Keller ............... H01L 21/02584 438/508

(Continued)

OTHER PUBLICATIONS

Mohanty, "N-polar GaN: Epitaxy, properties, and device applications", 2023 (available online Dec. 22, 2022), Progress in Quantum Electronics, vol. 87, p. 100450 (34 pages). (Year: 2023).*

(Continued)

*Primary Examiner* — Kim S. Horger
(74) *Attorney, Agent, or Firm* — Bell & Manning, LLC

(57) ABSTRACT

Methods for growing semi-insulating, carbon-doped (C-doped) group III-nitride on a substrate via metal-organic chemical vapor deposition (MOCVD) are provided. In the methods, the controlled timing of the introduction of carbon dopant precursors in the MOCVD growth process results in semi-insulating group III-nitride having a high crystal quality and surface morphologies. Some embodiments of the methods use a carbon dopant precursor pre-flow step in which a carbon dopant precursor is introduced into the MOCVD reactor chamber prior to the introduction of any group III precursors and the onset of film formation ("Pre-Flow"). In other embodiments of the methods, the introduction of carbon dopant precursors is delayed until after the onset of group III-nitride film coalescence ("Delayed-Doping").

18 Claims, 13 Drawing Sheets
(4 of 13 Drawing Sheet(s) Filed in Color)

(56) References Cited

U.S. PATENT DOCUMENTS

| | | | | |
|---|---|---|---|---|
| 2017/0253990 | A1* | 9/2017 | Kucharski | C01B 21/0632 |
| 2022/0069090 | A1* | 3/2022 | Suzuki | H01L 21/0254 |

OTHER PUBLICATIONS

Lyons, John L., et al. "Carbon complexes in highly C-doped GaN." *Physical Review B* 104.7 (2021): 075201.

Singh, Reetendra, Anand Roy, and C. N. R. Rao. "An Experimental Study of Carbon-Doped GaN via Solid-Gas Reaction Route and Investigation of Its Defect-Related Luminescence." *ACS Applied Electronic Materials* 4.6 (2022): 3147-3153.

Szymanski, Dennis, et al. "Systematic oxygen impurity reduction in smooth N-polar GaN by chemical potential control." *Semiconductor Science and Technology* 37.1 (2021): 015005.

Li, Xun, et al. "Carbon doped GaN buffer layer using propane for high electron mobility transistor applications: Growth and device results." *Applied Physics Letters* 107.26 (2015).

Keller, Stacia, et al. "Recent progress in metal-organic chemical vapor deposition of N-polar group-III nitrides." *Semiconductor Science and Technology* 29.11 (2014): 113001.

Lesnik, Andreas, et al. "Properties of C-doped GaN." *physica status solidi (b)* 254.8 (2017): 1600708.

Seifert, W., et al. "On the origin of free carriers in high-conducting n-GaN." *Crystal Research and Technology* 18.3 (1983): 383-390.

Stock, L., and W. Richter. "Vertical versus horizontal reactor: an optical study of the gas phase in a MOCVD reactor." *Journal of Crystal Growth* 77.1-3 (1986): 144-150.

Huang, D., et al. "Comparative study of Ga-and N-polar GaN films grown on sapphire substrates by molecular beam epitaxy." *Journal of Vacuum Science & Technology B: Microelectronics and Nanometer Structures Processing, Measurement, and Phenomena* 20.6 (2002): 2256-2264.

Kajikawa, Yuya, and Suguru Noda. "Growth mode during initial stage of chemical vapor deposition." *Appiied surface science* 245. 1-4 (2005): 281-289.

Zvanut, M. E., et al. "Incorporation of carbon in free-standing HVPE-grown GaN substrates." *Journal of Electronic Materials* 48 (2019): 2226-2232.

Khan, Ruby, et al. "Impact of growth conditions on intrinsic carbon doping in GaN layers and its effect on blue and yellow luminescence." *Journal of Materials Science: Materials in Electronics* 31 (2020): 14336-14344.

Mks, "Chemical Vapor Deposition Physics," https://www.mks.co,/n/cvd-physics Available on or before Oct. 26, 2022.

Pooth, Alexander, et al. "Charge movement in a GaN-based heterostructure field effect transistor structure with carbon doped buffer under applied substrate bias." *Journal of Applied Physics* 118.21 (2015).

Li, Xun, and Songran Zhu. "Properties of carbon-doped GaN using isobutane as a dopant." *Journal of Physics: Conference Series*. vol. 2011. No. 1. IOP Publishing, 2021.

Fariza, Aqdas, et al. "On reduction of current leakage in GaN by carbon-doping." *Applied Physics Letters* 109.21 (2016).

Reshchikov, M. A., et al. "Determination of the concentration of impurities in GaN from photoluminescence and secondary-ion mass spectrometry." *Scientific Reports* 10.1 (2020): 2223.

Li, Xun, et al. "Precursors for carbon doping of GaN in chemical vapor deposition." *Journal of Vacuum Science & Technology B* 33.2 (2015).

Gustafsson, Sebastian, et al. "Dispersive effects in microwave AlGaN/AIN/GaN HEMTs with carbon-doped buffer." *IEEE Transactions on Electron Devices* 62.7 (2015): 2162-2169.

Zhang, Rong, and Thomas F. Kuech. "Photoluminescence of carbon in situ doped GaN grown by halide vapor phase epitaxy." *Applied physics letters* 72.13 (1998): 1611-1613.

* cited by examiner

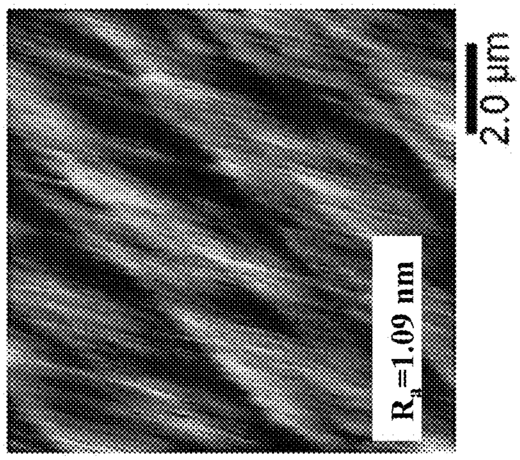
FIG. 7A
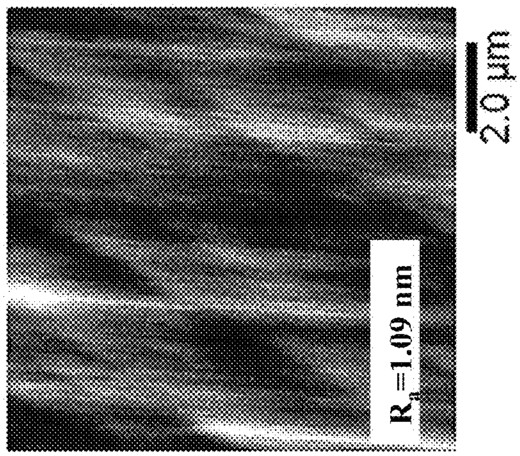
FIG. 7B
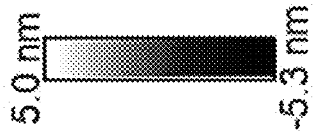
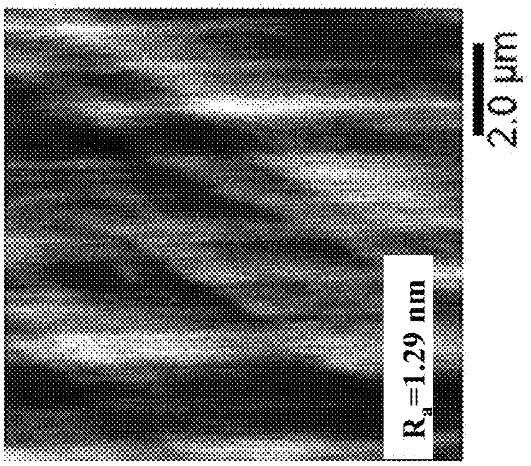
FIG. 7C
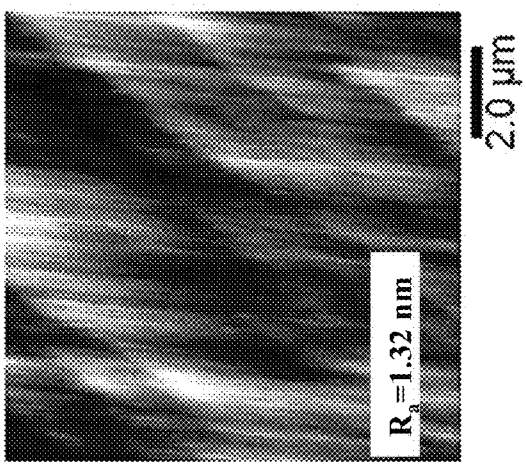
FIG. 7D
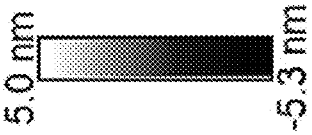

METAL ORGANIC CHEMICAL VAPOR DEPOSITION OF SEMI-INSULATING EXTRINSICALLY CARBON-DOPED GROUP III-NITRIDE FILMS

REFERENCE TO GOVERNMENT RIGHTS

This invention was made with government support under N00014-22-1-2267 awarded by the NAVY/ONR. The government has certain rights in the invention.

BACKGROUND

There is growing interest in gallium nitride (GaN) as a material for high-frequency and high-power applications, such as high electron mobility transistors (HEMTs) and other field effect transistors (FETs), due to its large band gap and high internal breakdown field. Unfortunately, GaN layers grown by current methods, such as metalorganic vapor phase epitaxy (MOVPE), result in dislocations and donor-like-impurities, such as residual oxygen or nitrogen vacancies, which cause n-type conductivity in unintentionally doped GaN. For GaN on oxygen-containing substrates, such as sapphire, oxygen incorporation is more problematic for N-polar GaN than for Ga-polar GaN, due to the higher nucleation temperature of the former.

Semi-insulating GaN is used as a buffer layer between a substrate and the active region of electronic devices to reduce leakage currents. This buffer layer must be highly resistive. Unfortunately, the defects and impurities in unintentionally-doped GaN increase the microwave losses and off-state leakage currents of FETs that incorporate the GaN because they provide a pathway for leakage through a GaN buffer layer. To solve the current leakage problem, carbon atoms have been incorporated as dopants in semi-insulating GaN during metal-organic chemical vapor deposition (MOCVD) growth to introduce acceptor states that compensate for the background impurities.

One way of incorporating carbon atom dopants into GaN using the MOCVD technique is auto-doping, also known as intrinsic C-doping, which uses the carbon atoms from the gallium precursor as dopants. However, it is difficult to maintain material uniformity and reproducibility using this approach, and this approach employs growth conditions that are sub-optimal for high-quality GaN growth. Therefore, an alternative process for carbon doping GaN has been developed in which a dedicated carbon dopant precursor, such as propane, is used as a carbon dopant source during MOCVD growth (extrinsic doping). In this process, the substrate is typically first exposed to gallium- and nitrogen-containing precursor gases to establish an optimal growth condition for GaN and the carbon dopant precursor is subsequently added to the MOCVD reactor to dope the growing film of GaN. While the use of carbon dopant precursors has improved the leakage problem in GaN buffer layers, further improvement is needed for GaN to realize its full potential in high-frequency and high-power applications.

SUMMARY

Semi-insulating, extrinsically carbon-doped group III-nitrides, such as gallium nitride, and methods for growing extrinsically carbon-doped group III-nitrides, such as gallium nitride, on a substrate via MOCVD are provided.

One embodiment of a semi-insulating, extrinsically carbon-doped gallium nitride layer on a substrate includes: the substrate; and a layer of extrinsically carbon-doped N-polar gallium nitride on a surface of the substrate, the layer of extrinsically carbon-doped N-polar gallium nitride having a carbon dopant concentration of at least $1\times10^{17}$ $cm^{-3}$, an electron concentration of no greater than $1\times10^{15}$ $cm^{-3}$, and a resistivity of at least 100 kΩ.

Another embodiment of a semi-insulating, extrinsically carbon-doped group III-nitride, such as gallium nitride, layer on a substrate includes: the substrate having a surface; and a layer of semi-insulating, extrinsically carbon-doped gallium nitride on the surface of the substrate, the layer of semi-insulating, extrinsically carbon-doped gallium nitride having a carbon dopant concentration of at least $1\times10^{17}$ $cm^{-3}$, an electron concentration of no greater than $1\times10^{15}$ $cm^{3}$, and a resistivity of at least 100 kΩ, wherein the layer of semi-insulating, extrinsically carbon-doped gallium nitride includes: a sub-layer of non-extrinsically carbon-doped gallium nitride having a thickness of greater than 10 nm on the surface of the substrate; and an overlayer of the extrinsically carbon-doped gallium nitride layer on the sub-layer of non-extrinsically carbon-doped gallium nitride.

An embodiment of a method for growing a semi-insulating, extrinsically carbon-doped group III-nitride film on a surface of a substrate includes the steps of: placing the substrate in a chemical vapor deposition reactor chamber; heating the substrate to a process temperature; flowing a nitrogen precursor gas into the chemical vapor deposition reactor chamber; flowing a carbon dopant precursor gas into the chemical vapor deposition reactor chamber, prior to the introduction of any group III precursor gas into the chemical vapor deposition reactor chamber and the onset of group III-nitride film growth, for a pre-flow period; and flowing a group III precursor gas into the chemical vapor deposition reactor chamber after the pre-flow period, whereby the group III precursor gas, the nitrogen precursor gas, and the carbon dopant precursor gas undergo reactions on the surface of the substrate to form the semi-insulating, extrinsically carbon-doped group III-nitride film. In some embodiments of these methods the group III-nitride is gallium nitride, such as N-polar gallium nitride, and/or the substrate is a sapphire substrate. In some embodiments of these methods the carbon dopant precursor gas comprises propane. In some embodiments of these methods the gallium and nitrogen precursor gases comprise trimethyl gallium and ammonia, respectively. In some embodiments of these methods, the pre-flow period has a duration of at least 10 seconds. In some embodiments of these methods, the pre-flow period has a duration of 60 seconds to 120 seconds.

Another method for growing a semi-insulating, extrinsically carbon-doped group III-nitride film on a surface of a substrate includes the steps of: placing the substrate in a chemical vapor deposition reactor chamber; heating the substrate to a nucleation temperature; flowing a group III precursor gas and a nitrogen precursor gas in the absence of a carbon dopant precursor gas into the chemical vapor deposition reactor chamber, whereby a gallium nitride film nucleates on the surface of the substrate at a nucleation temperature; heating the substrate and nucleated gallium nitride film to a coalescence temperature; continuing the flow of the group III precursor gas into the chemical vapor deposition reactor chamber in the absence of a carbon dopant precursor gas for a coalescence onset period, whereby the group III-nitride film coalesces into group III-nitride layer having a thickness of at least 10 nm; and after the coalescence onset period and while the group III precursor gas and the nitrogen precursor gas continue to flow into the chemical vapor deposition reactor chamber, flowing a carbon dopant precursor gas into the chemical vapor deposition reactor chamber, whereby carbon atoms from the carbon dopant precursor gas are incorporated as dopants into the group III nitride film on the semi-insulating, extrinsically carbon-doped group III-nitride film. In some embodiments of these methods, the group III-nitride is gallium nitride, such as N-polar gallium nitride and the group III precursor gas comprises a gallium-containing molecule and/or the substrate is a sapphire substrate. In some embodiments of these methods, the coalescence layer has a thickness in the range from 10 nm to 500 nm. In some embodiments of these methods, the carbon dopant precursor gas comprises propane. In some embodiments of these methods, the gallium and nitrogen precursor gases comprise trimethyl gallium and ammonia, respectively Other principal features and advantages of the invention will become apparent to those skilled in the art upon review of the following drawings, the detailed description, and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Illustrative embodiments of the invention will hereafter be described with reference to the accompanying drawings, wherein like numerals denote like elements.

FIGS. 7A-7D show AFM scans (10 μm×10 μm) of N-polar GaN sample growth using a $G_1$ growth condition (see Examples) with propane concentration of (FIG. 7A) 0 mmol/min, (FIG. 7B) 1.2 mmol/min, (FIG. 7C) 2.4 mmol/min, (FIG. 7D) 3.6 mmol/min.

DETAILED DESCRIPTION

Figure 1:
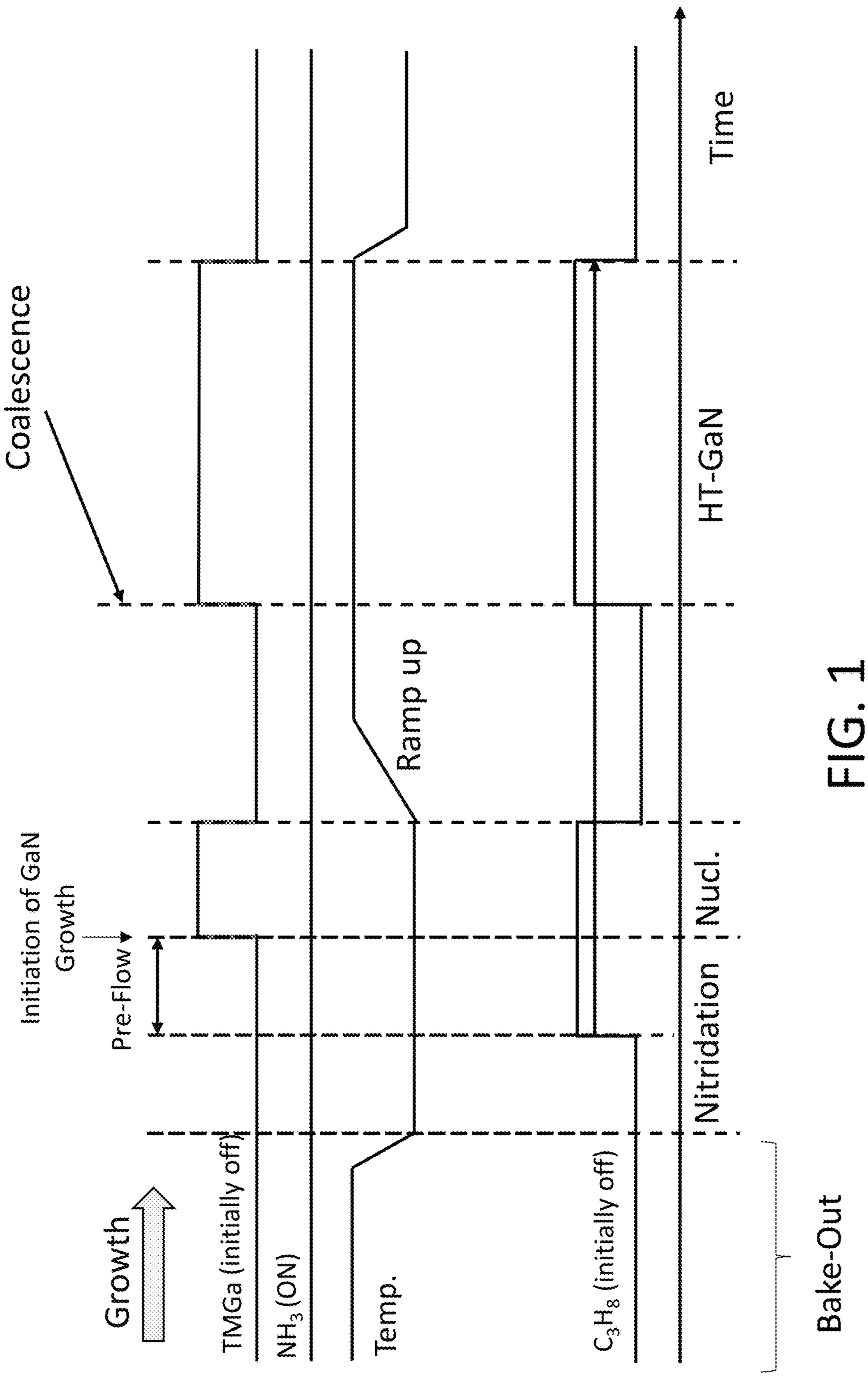
FIG. 1 shows an illustrative MOCVD process flow for the growth of semi-insulating, C-doped GaN using the Pre-Flow method.

Methods for growing semi-insulating, carbon-doped (C-doped) group III-nitride on a substrate via MOCVD are provided. In the methods, the controlled timing of the introduction of carbon dopant precursors in the MOCVD growth process results in semi-insulating group III-nitride having a high crystal quality and surface morphologies. Some embodiments of the methods use a carbon dopant precursor pre-flow step in which a carbon dopant precursor is introduced into the MOCVD reactor chamber prior to the introduction of any group III precursors and the onset of group III-nitride film formation ("Pre-Flow"). In other embodiments of the methods, the introduction of carbon dopant precursors is delayed until after the onset of group III-nitride film coalescence ("Delayed-Doping").

In the disclosure provided herein, group III-nitrides are exemplified with a focus on gallium nitride. However, the methods can be used in accordance with the methods described herein to grow other group III-nitrides by replacing a gallium precursor with a different group III precursor, which would be identifiable by those skilled in the art. Thus, the methods can be used to grow, for example, semi-insulating, carbon-doped AlN, InGaN, AlGaN, AlInN, AlInGaN, h-BN, BGaN, BAlN, BAlGaN, AlScN, InN, ScN, AlInScN, InScN, GaScN, InGaScN, InScN, YN, AlYN, GaYN, GaInYN, AlInYN, and AlGaYN, as well as GaN.

The Pre-Flow and Delayed-Doping methods can be used to grow semi-insulating N-polar or Ga-polar GaN on a variety of substrates. However, these methods are particularly useful for the growth of semi-insulating N-polar or Ga-polar GaN on oxygen-containing or silicon-containing substrates, such as sapphire, silicon, or silicon carbide, due to their ability to introduce high concentrations of carbon dopant atoms as deep acceptors into the GaN, without sacrificing crystal quality.

The semi-insulating GaN buffer films that are formed using Pre-Flow and Delayed-Doping are characterized by very high resistivities. In the case of Pre-Flow, the high resistivity can be attributed to the high concentration of carbon atom dopants throughout the GaN, include through the entire GaN nucleation layer at the substrate surface. In the case of Delayed-Doping, the high resistivity can be attributed to the high crystal quality of an extrinsic carbon dopant atom free GaN nucleation layer and a sub-layer within the GaN coalescence layer that is free of extrinsic carbon dopant atoms.

The carbon atoms incorporated as dopants in the semi-insulating GaN introduce acceptor states that compensate for oxygen impurities, thereby reducing leakage current through the semi-insulating GaN and enabling a high resistivity. High carbon dopant atom concentrations can be achieved using both Pre-Flow and Delayed-Doping. By way of illustration, carbon dopant concentrations in the range from $1\times10^{17}$ $cm^{-3}$ to $1\times10^{19}$ $cm^{-3}$, or even higher can be achieved. This includes embodiments of the semi-insulating GaN films having a carbon dopant concentration in the range from $1\times10^{18}$ $cm^{-3}$ to $1\times10^{19}$ $cm^{-3}$. (Methods for measuring the carbon dopant concentration are described the Examples below below.)

As a result of the high extrinsic carbon dopant concentration and high crystal quality of the GaN, the semi-insulating GaN films, including N-polar GaN films, grown with the Pre-Flow and Delayed-Doping methods can have resistivities of 1 MΩ or greater and are characterized by higher resistivities than semi-insulating GaN films that are grown using conventional MOCVD protocols under the same conditions, but without Pre-Flow and/or Delayed-Doping. Relative to these conventional MOCVD growth protocols, Pre-Flow and Delayed-Doping can increase the resistivity of GaN by an order of magnitude or more, as measured by a Hall test.

The semi-insulating GaN films grown with the Pre-Flow and Delayed-Doping methods are also characterized by low carrier concentrations. By way of illustration, semi-insulating, C-doped N-polar or Ga-polar GaN having a carrier concentrations of $1\times10^{15}$ $cm^{-3}$ or lower, including C-doped N-polar or Ga-polar GaN having a carrier concentrations of $1\times10^{14}$ $cm^{-3}$ or lower can be grown using these methods. For example, C-doped N-polar GaN having a carrier concentrations in the range from $1\times10^{12}$ $cm^{-3}$ to $1\times10^{15}$ $cm^{-3}$ can be grown.

The Pre-Flow and/or Delayed-Doping methods can also produce a semi-insulating GaN film having a lower surface roughness than a semi-insulating GaN film that is grown under the same conditions, but without Pre-Flow and/or Delayed Doping. By way of illustration, semi-insulating GaN films having an RMS surface roughness of less than 2 nm, less than 1.5 nm, or less than 1.0 nm over a 2 μm×2 μm surface area, as measured by Atomic Force Microscopy (AFM), can be grown. This includes embodiments of the semi-insulating GaN films having a surface roughness of less than 0.65 nm, as measured by AFM.

Pre-Flow.

An illustrative MOCVD process flow for the growth of semi-insulating, C-doped GaN using the pre-flow method is shown in FIG. 1. (The specific precursors shown in FIG. 1 are for illustrative purposes only.) In preparation for GaN growth, an MOCVD reactor chamber housing a substrate upon which the semi-insulating, C-doped GaN is to be grown undergoes a high-temperature bake-out. After the bake-out, a nitrogen precursor gas (e.g., $NH_3$) is introduced into the reactor to carry out the nitridation of the substrate surface.

Next, a carbon dopant precursor gas is fed into the reactor chamber and the substrate is exposed to the carbon dopant precursor gas for a period of time prior to the introduction of one or more gallium precursor gases. This step of flowing the carbon dopant precursor into the reactor chamber prior to the introduction of the gallium precursors is referred to herein as the pre-flow step. At the end of pre-flow period and while the carbon dopant precursor gas and the nitrogen precursor gas continue to flow into the reactor chamber, one or more gallium precursor gases (e.g., trimethyl gallium, TMGa) are introduced into the reactor chamber to initiate the nucleation (nucl.) of a C-doped GaN film on the substrate surface at a nucleation temperature.

Typically, after GaN nucleation, the flow of the gallium precursor and carbon dopant precursor gases is paused while the temperature of the substrate and nucleated GaN is ramped up to prepare for continued GaN film growth via coalescence, which takes place at a higher temperature than film nucleation. For the purposes of this disclosure the temperature at which GaN film growth through nucleation takes place is referred to as the nucleation temperature and the temperature at which GaN film growth through coalescence takes place is referred to as the coalescence temperature. Once the coalescence temperature is reached, the flow of the gallium and carbon dopant precursor gases is resumed and the growth of the C-doped GaN film continues via coalescence.

The carbon dopants in GaN films made with the Pre-Flow methods are distributed uniformly through the thickness of the semi-insulating GaN film, starting at the interface with the substrate surface. As a result, the C-doped GaN films produced using Pre-Flow have lower leakage currents and substantially higher resistivities than C-doped GaN films made by introducing a carbon dopant precursor gas into a MOCVD reactor chamber after GaN nucleation or by introducing the carbon dopant precursor gas and the gallium precursor gas into the MOCVD reactor chamber simultaneously.

The Pre-Flow method is based, at least in part, on the inventors' discovery that, even when carbon dopant precursor and gallium precursor gases are introduced simultaneously into a MOCVD reactor at the outset of the MOCVD process, there is a delay in the incorporation of carbon atoms into the GaN film. As a result, a low carbon concentration region is formed at the interface of the GaN film with the substrate surface. The presence of the low-carbon-doped GaN region near this interface is problematic because it provides a pathway for undesired current leakage through the GaN buffer layer and limits the resistivity of the GaN, thereby rendering the C-doped GaN unsuitable for many applications.

Without wishing or intending to be bound to any theories of the inventions described herein, it is proposed that pre-exposing the substrate surface to the carbon dopant precursor gas enables the carbon dopant precursor molecules to adsorb on the surface and prepares the adsorbed carbon dopant precursor molecules for reaction with the GaN precursors as soon as the GaN precursors reach the surface. This pre-exposure significantly enhances the carbon atom dopant incorporation, which in turn improves the material resistivity relative to that of GaN grown by introducing the carbon dopant gas simultaneously with the gallium precursor gas into the MOCVD reactor chamber or with a time delay after the gallium precursor introduction. The absence of a carbon-free or low-carbon layer can be confirmed by Secondary Ion Mass Spectrometry (SIMS) measurements of the carbon atom concentration through the thickness of the GaN layer, including the nucleation layer. Data in support of the improvements realized by the pre-flow step in comparison with a conventional simultaneous flow step is provided in Example 1.

Delayed-Doping.

The Pre-Flow method is based, at least in part, on the inventors' discovery that delaying carbon doping during MOCVD growth until after the GaN nucleation layer is formed and also after at least 10 nm, and desirably at least 50 nm, of the GaN coalescence layer has formed enables the formation of a semi-insulating GaN layer.

While not intending to be bound to any one theory of this aspect of the invention, the ability to obtain semi-insulating behavior may be attributed to a more than one order higher carbon dopant concentration compared to the oxygen atom impurity concentration in the bulk N-polar or Ga-polar GaN. This higher carbon concentration may be sufficient to fully compensate for the increased oxygen level at the interface. Another possible explanation may be that the higher oxygen atom impurity level exists near the nucleation layer and it is not fully electrically conductive. In the nucleation layer, the N-polar GaN film quality may not be as good as that of the bulk. So, even if the oxygen atom concentration is higher near the interface it may not provide a fully conductive path.

Figure 2A:
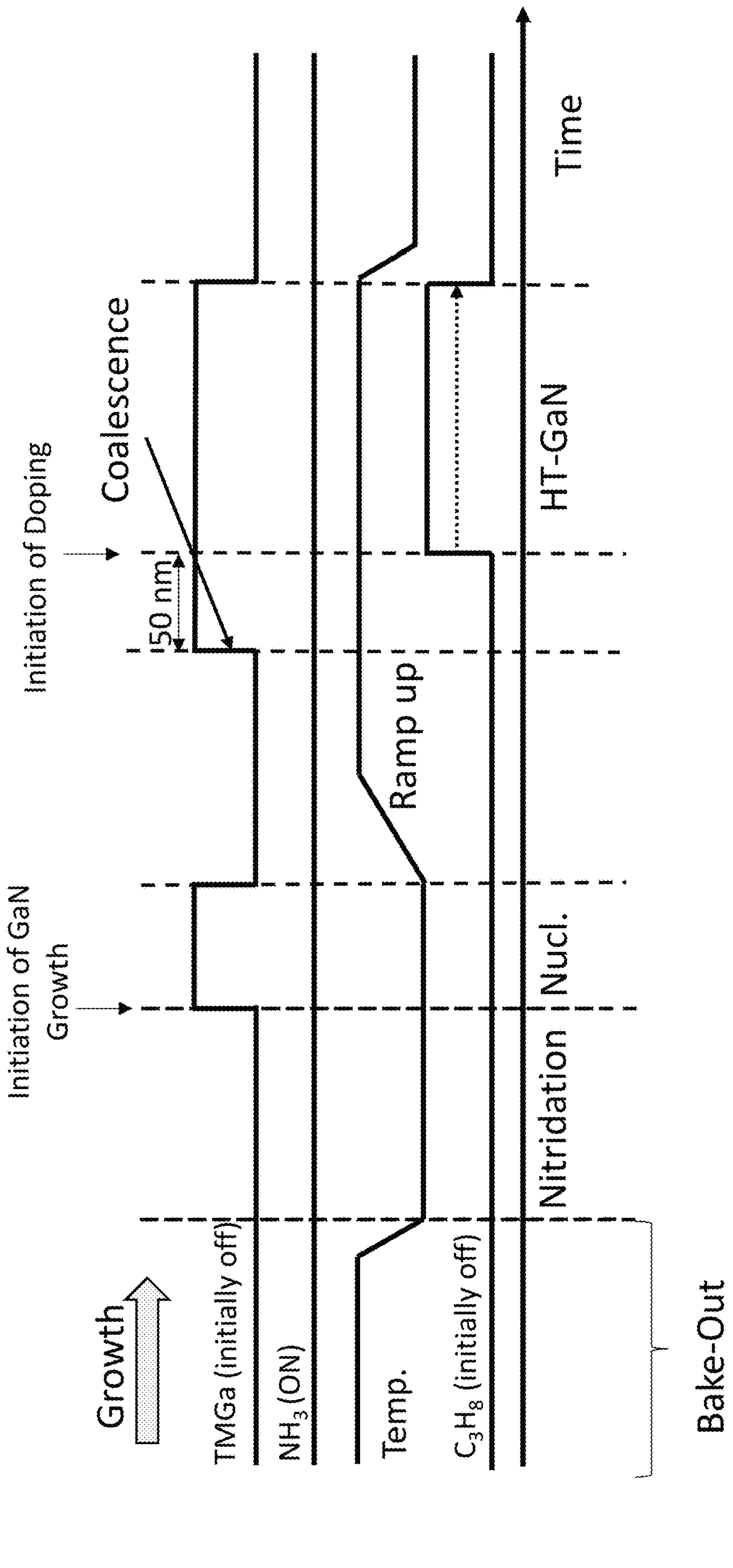
FIG. 2A shows an illustrative MOCVD process flow for the growth of semi-insulating, C-doped GaN using the Delayed-Doping methods.
Figure 2B:
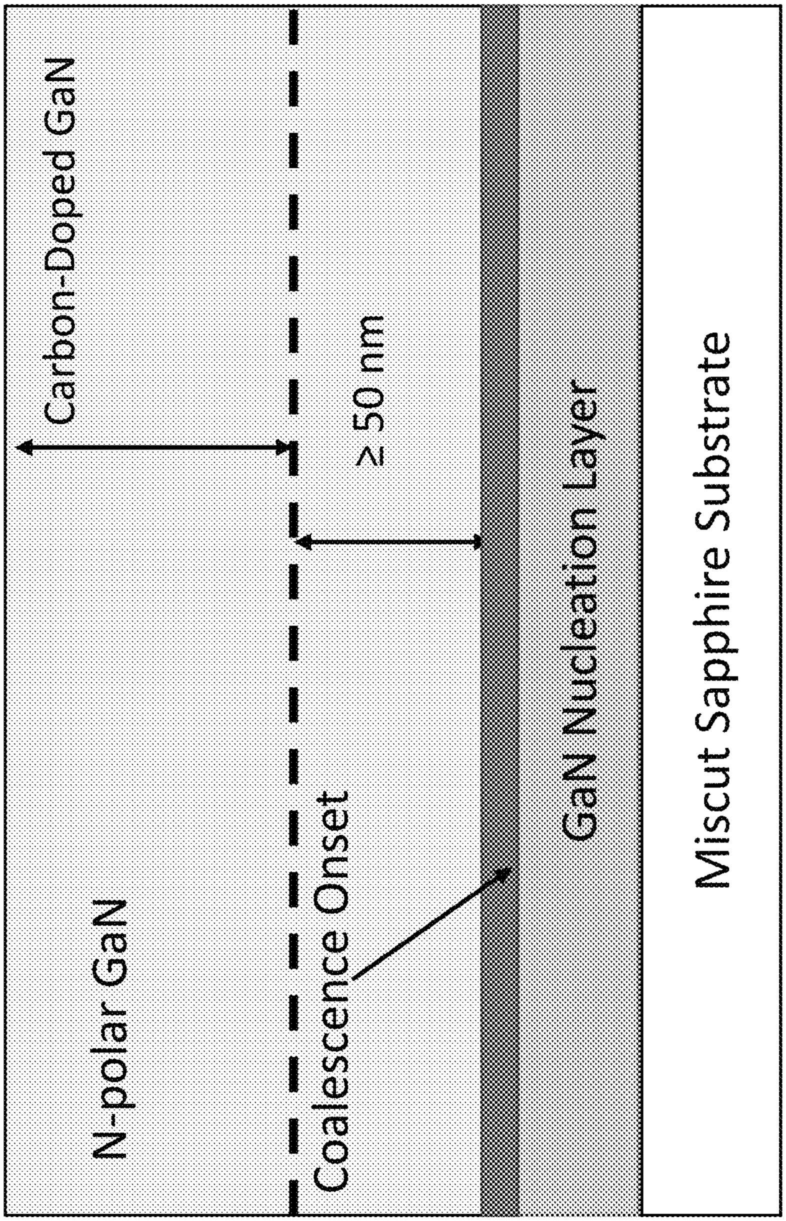
FIG. 2B shows a schematic diagram of one example of a GaN film grown using the Delayed-Doping.

An illustrative MOCVD process flow for the growth of semi-insulating, C-doped GaN using the delayed-doping method is shown in FIG. 2A and a schematic diagram of one example of a GaN film grown using the delayed doping method is shown in FIG. 2B. (As in FIG. 1, the specific precursors shown in FIGS. 2A and 2B are for illustrative purposes only.) In preparation for GaN growth, an MOCVD reactor chamber housing a substrate upon which the semi-insulating, C-doped GaN is to be grown undergoes a high-temperature bake-out and a flow of a nitrogen precursor gas (e.g., $NH_3$) into the reactor chamber is initiated. After the bake-out, the nitrogen precursor gas continues to flow to carry out the nitridation of the substrate surface.

Next, while the nitrogen precursor gas continues to flow into the reactor chamber, one or more gallium precursor gases (e.g., TMGa) are introduced into the reactor chamber to initiate the nucleation (nucl.) of a GaN film on the substrate surface at a nucleation temperature.

Typically, after GaN nucleation, the flow of the gallium precursor gas is paused while the temperature of the substrate and nucleated GaN is ramped up to prepare for continued film growth via coalescence, which takes place at a higher temperature than film nucleation. Once the coalescence temperature is reached, the flow of the gallium precursor gas is resumed and the growth of the GaN film continues via coalescence. The GaN film growth is allowed to continue until the coalesced GaN layer reaches a thickness of 10 nm or higher, at which point a carbon dopant precursor is flowed into the reactor chamber to introduce carbon atom dopants into the growing GaN film for the remainder of the MOCVD growth process. (The onset of coalescence may be determined via reflectance measurements.) In some embodiments of the growth methods, the GaN layer is grown to a thickness of from 10 nm to 500 nm, including from 50 nm to 100 nm, after the onset of coalescence before the carbon dopant precursor is introduced into the reactor. Depending up the extent of the delay, the carbon dopant precursor may be introduced as the GaN film is undergoing coalescence or during a post-coalescence, sustained vertical growth stage.

A cross-sectional view of a GaN film grown on a sapphire substrate using the delayed-doping methods is shown in FIG. 2B. The GaN film includes an undoped GaN nucleation layer, an undoped GaN coalescence layer over the undoped GaN nucleation layer and a C-dope GaN layer over the GaN coalescence layer.

By avoiding carbon dopant atom incorporation during the nucleation phase and the initial coalescence phase of the GaN film growth process, the delayed-doping methods produce semi-insulating C-doped GaN having improved crystal quality and surface morphology (i.e., lower surface roughness, including RMS roughnesses of 1.5 nm or lower) than semi-insulating C-doped GaN that is grown via a comparable MOCVD process in which the carbon dopant precursors are present during GaN nucleation and the onset of GaN coalescence.

Precursors, Substrates, and Growth Conditions.

Carbon Dopant Precursors.

The carbon dopant precursors used in the pre-flow and delayed-doping methods are carbon-containing compounds that decompose on the surface of the substrate to produce carbon atoms adsorbed on the substrate surface. The carbon dopant precursors are introduced into the MOCVD reactor chamber, typically along with an inert carrier gas, and are transported to the substrate surface via fluid transport and/or diffusion. Thus, the precursors should have a sufficiently high vapor pressure to allow for a stable and controllable gas flow into the MOCVD reactor chamber and should be sufficiently heavy to stick to the substrate surface. Examples of suitable carbon dopant precursors include propane, ethane, butane, isobutane, ethylene, methane, acetylene, tetrabromoethane, trimethylamine, and triethylamine.

Group III and Nitrogen Precursors.

The gallium and nitrogen precursors used in the pre-flow and delayed-doping methods are compounds that react on the surface of the substrate during the MOCVD process to produce a solid group III-nitride film and, as such, are compounds that include, for example, Ga atoms (gallium precursors) or N atoms (nitrogen precursors). The gallium and nitrogen precursors may include one or more Ga-containing precursors and one or more N-containing precursors. Examples of suitable Ga-containing precursors include organometallic molecules, such as, but not limited to, trimethyl gallium (TMGa), or triethylgallium (TEGa). Other examples of group III precursors include trimethyl aluminum, trimethyl indium, trimethyl borate, trimethyl borane, Sc-containing precursors (for example $Cp_3Sc$ or $(MeCp)_3Sc$), and Y-containing precursors.

Examples of suitable N-containing precursors include nitrogen hydrides, such as, but not limited to, ammonia. The precursors are desirably of extremely high purity in order to minimize or eliminate the incorporation of unwanted impurities in the deposited film.

Substrates.

The semi-insulating, C-doped GaN films can be grown on a variety of substrates that are suitable for epitaxial growth. The selection of a growth surface will depend on the desired polarity of the GaN. The crystal direction [0001] of a GaN film can be either parallel or antiparallel to the growth direction, resulting in the growth of either Ga-polar or N-polar GaN, respectively. Examples of suitable substrates for the growth of N-polar or Ga-polar GaN include GaN, AlN, sapphire ($Al_2O_3$), including miscut C-plane sapphire, silicon carbide (SiC), including miscut SiC, and silicon (Si). The substrate upon which the GaN is epitaxially grown may be a bulk material or may be a layer of material that is itself grown on another underlying substrate.

The present methods are particularly useful when the substrate upon which the semi-insulating, C-doped GaN film is grown, referred to herein as the growth substrate, contains oxygen or silicon and the MOCVD growth is carried out under high-temperature conditions. This is because, under high-temperature MOCVD growth conditions, oxygen or silicon atoms are released from the substrate and become impurities in the GaN film, where they act as n-type dopants. The high carbon atom dopant concentrations—even at the substrate-GaN film interface in the case of the pre-flow step—can compensate for these oxygen atom impurities. By way of illustration, MOCVD growth of N-polar GaN is an example of a MOCVD process that is carried out at a high temperature (e.g., ≥1000° C.), compared to the growth of Ga-polar via MOCVD, which can be carried out around 632° C. Therefore, when N-polar GaN is grown via MOCVD on sapphire, oxygen atoms from the sapphire are released into the N-polar GaN during high-temperature processing. Without the pre-flow step, these oxygen impurities are poorly compensated in the carbon-free region of the MOCVD GaN film near the sapphire substrate. However, when the pre-flow step is included in the MOCVD process, the high concentration of carbon dopants even at the GaN/sapphire interface can compensate for the oxygen impurities.

It is also desirable to use substrates that do not include carbon atoms, as those atoms may unintentionally dope the GaN film during MOCVD growth in a manner that is difficult to control and that results in a non-uniform carbon atom dopant profile near the interface. For example, AlN is an example of a substrate upon which GaN films, including Ga-polar GaN, can be grown.

MOCVD Growth Stages and Conditions.

Substrate Preparation.

In preparation for MOCVD growth, a substrate is loaded into the MOCVD reactor chamber and heated to a process temperature under hydrogen ambient, typically after an in-situ high temperature (e.g., 1200 to 1300° C.) bake-out to remove the moisture and other impurities from the chamber. Nitridation of the growth substrate surface may then be carried out by the exposure of said surface to the nitrogen precursor gas at a nitridation temperature. During nitridation, nitrogen atoms from the nitrogen precursor replace oxygen atoms at the surface. Nitridation is typically carried out a temperature lower than the bake-out and coalescence temperatures. Illustrative nitridation temperatures include temperatures in the range from 1100° C. to 1200° C. for N-polar GaN and 450° C. to 600° C. for Ga-polar GaN.

During MOCVD growth, a solid film of C-doped GaN is formed epitaxially on a substrate surface by the thermal decomposition of the carbon dopant precursors, gallium precursors and nitrogen precursors on the surface. The precursor molecules adsorb onto the surface of the substrate where they undergo heterogeneous and/or decomposition reactions. As a result of these reactions, gallium and nitrogen atoms from the precursors remain on the surface as adatoms, while other by-product molecules desorb. By way of illustration, ammonia molecules adsorbed on the surface decompose to produce nitrogen adatoms and hydrogen molecules desorb into the gas phase. MOCVD growth takes place through a number of stages.

The MOCVD reactor conditions can be adjusted for each stage of growth to realize a semi-insulating C-doped GaN buffer layer having electronic properties suitable for an intended application.

Whether carbon doping is carried out using Pre-Flow or Delayed Doping, the MOCVD growth conditions, such as carbon dopant precursor flow rate, may be (but need not be) selected to provide a uniform carbon concentration throughout the C-doped portion of the GaN. Moreover, while a high carbon dopant concentration is generally desirable, it is sufficient to have a carbon dopant concentration that compensates for the impurity-induced carriers that form in the semi-insulating GaN. Once this carbon dopant concentration is achieved, there is no need to exceed it and, if the carbon dopant concentration becomes too high, it is possible to degrade the crystal quality of the GaN.

Generally, a high gallium-containing precursor flow rate (flux), a low reactor process pressure, and a low process temperature promote carbon-dopant incorporation during MOCVD GaN film growth and result in a semi-insulating GaN film with a high resistivity. In addition, a higher ratio of gallium precursor to nitrogen precursor typically produces a semi-insulating GaN film with a higher resistivity. The process pressure during the MOCVD growth process may be chosen such that it corresponds to an optimal process pressure for GaN growth.

Suitable MOCVD reactor conditions and methods for determining suitable MOCVD reactor conditions for Pre-Flow and Delayed-Doping are presented in Example 1 and Example 2, respectively. Additional guidance may be found in the literature on MOCVD growth of GaN. (See, for example, Keller, Stacia, et al. "Recent progress in metal-organic chemical vapor deposition of N-polar group-III nitrides." Seniconductor Science and Technology 29.11 (2014): 113001.) Exemplary ranges for various MOCVD reactor conditions are presented below for guidance. However, reactor conditions outside of the ranges presented here can be used.

Pre-Flow.

If the GaN is grown using Pre-Flow, the carbon dopant precursor may be introduced during the nitridation process—typically toward the end of the nitridation process—or after nitridation is complete. For Pre-Flow, suitable flow rates for the carbon dopant precursors during the pre-flow period include flow rates in the range from 0.1 millimole per minute (mmol/min) to 10 mmol/min. This includes flow rates in the range from 0.5 mmol/min to 5 mmol/min.

Suitable process pressures during the pre-flow period include pressures in the range from 50 mbar to 600 mbar. This includes pressures in the range from 50 mbar to 600 mbar for Ga-polar GaN growth, while pressures in the range from 50 mbar to 300 mbar may be preferable for N-polar GaN s growth.

Suitable substrate temperatures during the pre-flow period include temperatures in the range from 450° C. to 660° C. for Ga-polar GaN substrate growth, and 950° C. to 1200° C. for N-polar GaN substrate growth.

The duration of the pre-flow period should be sufficiently long that enough C atoms are delivered onto the substrate to compensate for impurity-induced carriers. However, too long of a duration may cause the degradation of material quality. Therefore, suitable pre-flow periods include those in the range from 60 seconds (s)-120 s for Ga-polar GaN, while a pre-flow period in the range from 15 s-300 s may be preferable for N-polar GaN.

GaN Nucleation.

In the earliest phase of MOCVD, the Ga and N adatoms are mobile and migrate across the surface of the substrate until they reach a high-energy surface site or trap site on which the adatom becomes immobilized. The immobilized atoms provide the starting point for the nucleation phase of the MOCVD process. During the nucleation phase, GaN nuclei ("islands") grow in the vertical and lateral directions on the substrate surface via the incorporation of mobile Ga and N adatoms. Nucleation layers typically have a thickness in the range from about 10 nm to about 20 nm. However, thicknesses outside of this range are possible. During Pre-Flow MOCVD, carbon atoms are already present at the surface due to the pre-flow step and, therefore, carbon dopants are incorporated into the growing GaN film even at the nucleation stage.

If Pre-Flow is being used, suitable flow rates for the carbon dopant precursors during GaN film nucleation include flow rates in the range from 0.1 mmol/min to 10 mmol/min. This includes flow rates in the range from 0.5 mmol/min to 5 mmol/min.

Suitable flow rates for the gallium precursors during film nucleation include flow rates in the range from 30 micro mole per minute (μmol/min) to 60 μmol/min for Ga-polar GaN, while flow rates in the range from 10 μmol/min to 50 μmol/min may be preferable for N-polar GaN.

Suitable flow rates for the nitrogen-containing precursors during GaN film nucleation include flow rates in the range from 50 mmol/min to 200 mmol/min. This includes flow rates in the range from 90 mmol/min to 180 mmol/min.

Suitable process pressures during film nucleation include pressures in the range from 50 mbar to 600 mbar. This includes pressures in the range from 50 mbar to 600 mbar for Ga-polar GaN, while pressures in the range from 50 mbar to 300 mbar may be preferable for N-polar substrate growth.

Nucleation temperatures are typically in the range from about 500° C. to 1200° C. This includes nucleation temperatures in the range from 450° C. to 660° C. for Ga-polar GaN, and 950° C. to 1200° C. for N-polar GaN growth.

GaN Coalescence.

As they grow, the GaN nuclei begin to coalesce into a coherent film layer. This begins the phase of the MOCVD known as coalescence. As coalescence continues, complete coalescence of the nuclei is eventually achieved and sustained vertical growth of GaN from the coalesced film commences and is continued until a semi-insulating GaN film having a desired thickness is formed.

Suitable flow rates for the carbon dopant precursors during film coalescence include flow rates in the range from 0.1 mmol/min to 10 mmol/min. This includes flow rates in the range from 0.5 mmol/min to 5 mmol/min.

Suitable flow rates for the gallium-containing precursors during film coalescence include flow rates in the range from 50 μmol/min to 250 μmol/min. This includes flow rates in the range from 90 μmol/min to 210 μmol/min.

Suitable flow rates for the nitrogen-containing precursors during film nucleation include flow rates in the range from 50 mmol/min to 200 mmol/min. This includes flow rates in the range from 90 mmol/min to 180 mmol/min.

Suitable process pressures during film coalescence include pressures in the range from 50 mbar to 600 mbar. This includes pressures in the range from 50 mbar to 600 mbar for Ga-polar GaN, while pressures in the range from 50 mbar to 300 mbar may be preferable for N-polar GaN growth.

Suitable coalescence temperatures include temperatures in the range from 950° C. to 1600° C. This includes temperatures in the range from 1000° C. to 1300° C.

Sustained Vertical GaN Film Growth.

Because sustained vertical growth takes place at a high temperature, this layer is sometimes referred to as a high-temperature (HT) GaN layer. Sustained growth is continued until a semi-insulating GaN film having a desired thickness is achieved. By way of illustration, for use as buffer layers in a HEMT, the semi-insulating GaN layer typically has a thickness in the range from 1 μm to 15 μm, including in the range from 2 μm to 10 μm.

Suitable flow rates for the carbon dopant precursors during sustained C-doped GaN growth include flow rates in the range from 0.1 mmol/min to 10 mmol/min. This includes flow rates in the range from 0.5 mmol/min to 5 mmol/min.

Suitable flow rates for the gallium-containing precursors during sustained C-doped GaN growth include flow rates in the range from 50 μmol/min to 200 μmol/min. This includes flow rates in the range from 90 μmol/min to 180 μmol/min.

Suitable flow rates for the nitrogen-containing precursors during film nucleation include flow rates in the range from 50 mmol/min to 200 mmol/min. This includes flow rates in the range from 90 mmol/min to 180 mmol/min.

Suitable process pressures during sustained C-doped GaN growth include pressures in the range from 50 mbar to 600 mbar. This includes pressures in the range from 50 mbar to 600 mbar for Ga-polar GaN, while pressures in the range from 50 mbar to 300 mbar may be preferred for and N-polar GaN growth.

Suitable substrate temperatures during sustained C-doped GaN growth include temperatures in the range from 950° C. to 1600° C. This includes temperatures in the range from 1000° C. to 1300° C.

MOCVD Reactors.

The reactions of the precursors on the substrate surface are thermally driven and, therefore, the MOCVD reactor is equipped with a heater, or other energy source, in thermal communication with the substrate to heat the substrate to a temperature that promotes these reactions and enables the adatoms to migrate on the surface, which produces nucleation and, subsequently, coalescence and continuous film growth. Suitable energy sources include, but are not limited to, resistive heaters, inductive heaters, and infrared lamps. The MOCVD reactor will also include a vacuum pump in fluid communication with the reactor chamber to remove the by-product gasses and maintain the chamber pressure at a desired process pressure during film growth. Optionally, a rotating stage may be used to rotate the substrate during MOCVD growth to improve the uniformity of the deposition.

The precursors in MOCVD are introduced into the reaction chamber along with an inert carrier gas, and are transported to the substrate surface via fluid transport and/or diffusion. Therefore, the MOCVD reactors are equipped with the valves, tubing, flow controllers, and the like to facilitate the controlled introduction of the carrier gases and gaseous precursors into the chamber.

The MOCVD reactor may be a horizontal or a vertical reactor. In a horizontal reactor, the precursor gases are introduced at the side of the reactor chamber, through one or more gas inlets in a side-wall of the chamber. The precursors then diffuse in a horizontal direction toward the heated growth substrate, which may be mounted in a horizontal orientation or tilted toward the incoming gas flow. In a vertical reactor, the precursor gases are introduced at or near the top of the reactor chamber, through one or more gas inlets in the ceiling or top side wall of the chamber. The ability to carry out the present MOCVD growth methods in a vertical MOCVD reactor is advantageous because, relative to a horizontal MOCVD reactor, a vertical MOCVD reactor provides a narrow and homogeneous high temperature zone at the substrate surface, which results in more homogeneous growth.

EXAMPLES

Example 1: Precursor Pre-Flow

This example illustrates GaN MOCVD growth with carbon dopant precursor pre-flow and demonstrates its advantages over analogous GaN MOCVD growth processes that lack a pre-flow step.

A semi-insulating layer of Ga-polar GaN was grown on a sapphire substrate via MOCVD. Trimethylgallium (TMGa) and ammonia ($NH_3$) were used as group-III precursors and group-V precursors, respectively. Propane was used as a carbon (C) dopant and $H_2$ was used as a carrier gas.

Experiment

Because semi-insulating GaN has a large resistivity when performing a Hall test, capacitance-voltage (CV), and resistance measurements were used to confirm the semi-insulating behavior. For the CV measurements, a larger depletion width and lower carrier concentration indicate a higher resistivity. Once the carrier concentration became extremely low, the CV setup reached its detection limit. For the Hall/resistance measurements, the setup also reached its detection limit once the GaN became semi-insulating.

The crystal quality of the GaN, which is also important for achieving semi-insulating GaN, was characterized by Atomic Force Microscopy (AFM) and X-Ray Diffraction (XRD). For the AFM measurements, a lower root mean square (rms or RMS) value corresponds to a smoother surface and better GaN film quality. For XRD, a lower full width half maximum (FWHM) of the rocking curve [(002) and (102)] corresponds to better GaN film quality.

For all experiments, the sapphire sample was heated at 1300° C. and nitridation was performed prior to a growth of a nucleation layer at 632° C.

The GaN nucleation layer was grown on the sapphire substrate at a nucleation temperature of 632° C., a pressure of 600 mbar. During film nucleation the TMGa and $NH_3$ flow rates were maintained at 18 sccm and 1200 sccm, respectively.

After GaN nucleation, the temperature was increased to temperatures in the range from 1237° C. to 1259° C. for the growth of the GaN coalescence layer. The TMGa flow rate and the propane flow rate were set to be 80 sccm and 2.4 mmol/min. The $NH_3$ and chamber pressure were in the range of 2500 sccm-5000 sccm, and 75-150 mbar.

A high-temperature (HT) GaN layer was deposited after the coalescence was complete, at a temperature of 1270° C., a pressure of 75 mbar, and a TMGa flow rate of 57 sccm. The $NH_3$ flow rate was controlled to be 3600 sccm.

Figure 3:
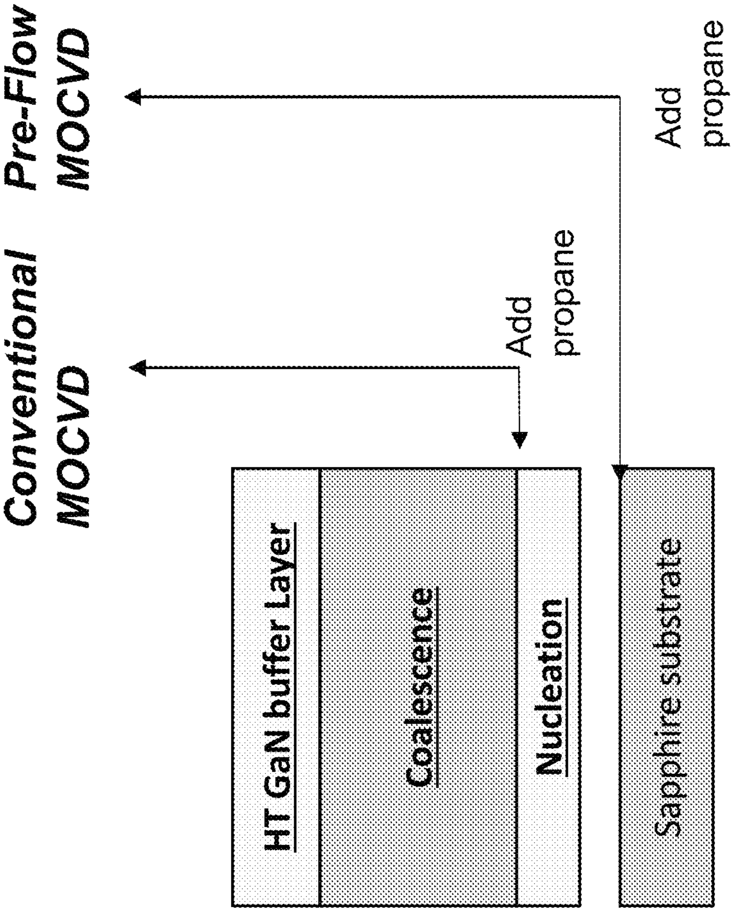
FIG. 3 shows the points at which a carbon dopant precursor (e.g., propane) is added during MOCVD growth using Pre-Flow MOCVD and using conventional MOCVD.

A semi-insulating, extrinsically carbon-doped GaN film was grown using the Pre-Flow method and a comparative, extrinsically carbon-doped GaN film was grown using the conventional approach of introducing the propane and the TMGa together at the start of the GaN coalescence ("C-Doped") (FIG. 3). Additionally, an unintentionally doped GaN film was grown using the same conditions for comparison. The results of these experiments are shown in Tables 1A and 1B.

TABLE 1A

| Sample | Multimeter (kΩ) | AFM (nm) | XRD FWHM (002) | XRD FWHM (102) |
|---|---|---|---|---|
| No extrinsic doping | 6.14 kΩ | 0.473 | 277.99 | 499.25 |
| Conventional | 17.6 MΩ | 1.28 | 417.24 | 1495.44 |
| Pre-Flow | >100 MΩ | 0.619 | 433.08 | 1605.96 |

TABLE 1B

| Sample | Resistivity Sheet (ohm/sq) | Resistivity Bulk (ohm · cm) | Mobility ($cm^2$/Vs) | Concentration Sheet ($cm^{-2}$) | Concentration Bulk ($cm^{-3}$) | CV Depletion width | CV carrier concentration ($cm^{-3}$) |
|---|---|---|---|---|---|---|---|
| No extrinsic doping | 3084 | 0.9253 | 37.6 | 5.46E+13 | 1.82E+17 | 2 μm | 6.50E+16 |
| Conventional | | | Over limit | | | 4.62 μm | 8.60E+15 |
| Pre-Flow | | | Over limit | | | Over limit | |

Figure 4A:
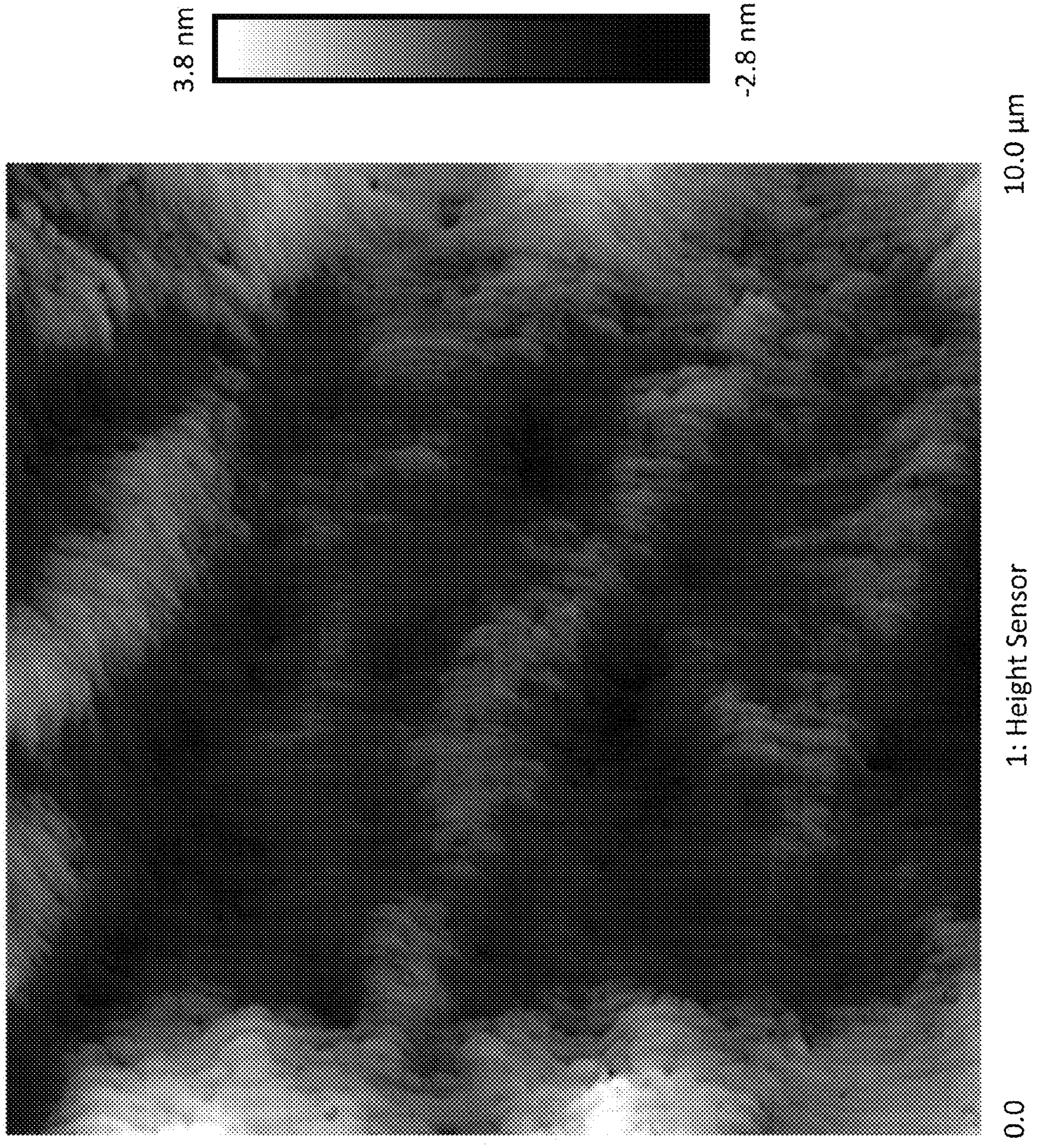
FIG. 4A shows and AFM image of a carbon-doped MOCVD film made using Pre-Flow MOCVD with an RMS roughness of 0.6 nm.
Figure 4B:
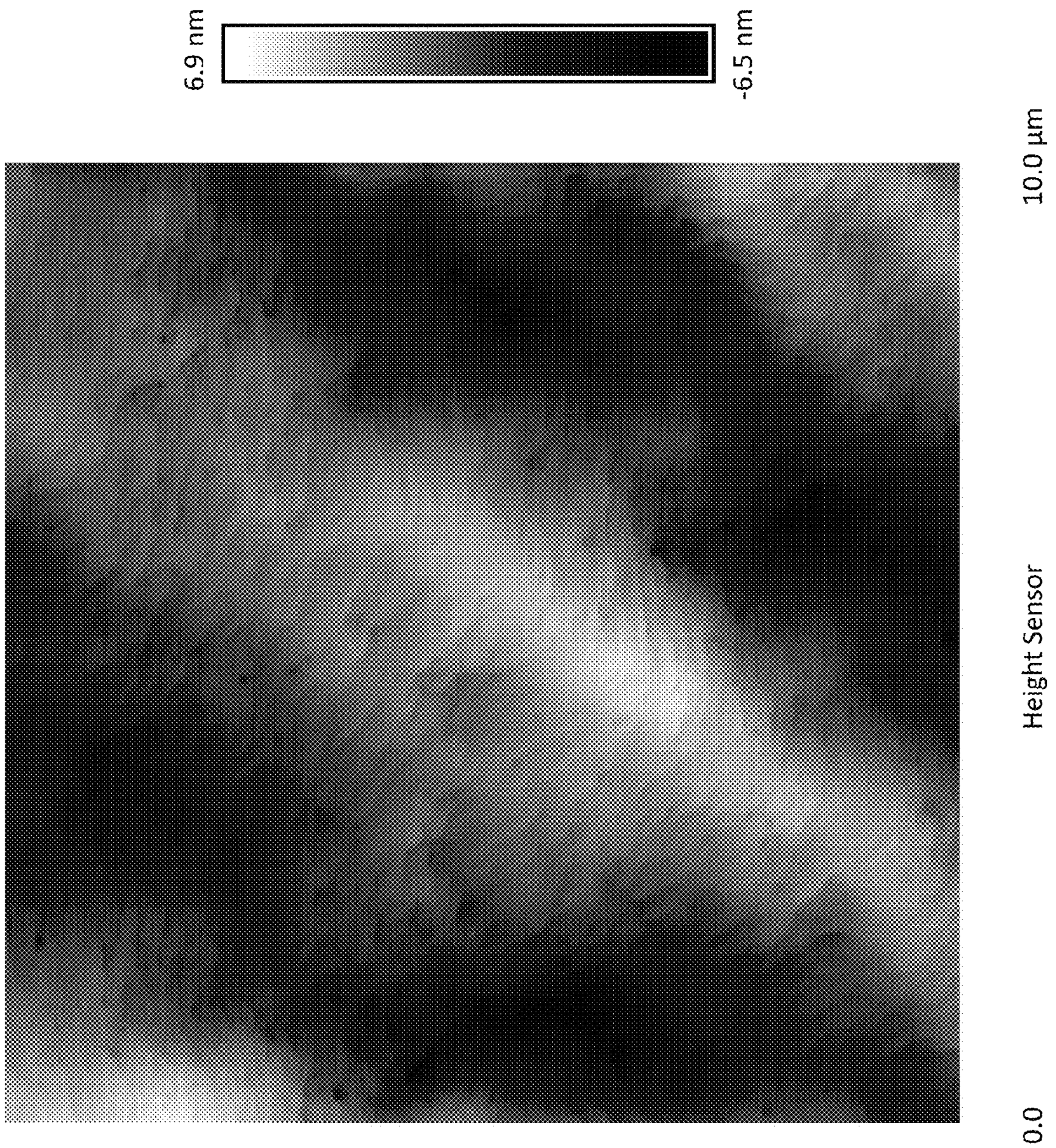
FIG. 4B shows an AFM image of a carbon-doped MOCVD film made using conventional MOCVD with an RMS roughness of 1.3 nm.

The resistivity of the GaN films was measured at the center of GaN film wafer. The sheet and bulk resistivities for conventional MOCVD and Pre-Flow MOCVD are not included in Table 1A and 1B because they were beyond the equipment measurement limit. These data show that, while equipment was not able to distinguish the resistivities of the GaN films grown by Pre-Flow and conventional MOCVD beyond 1 MΩ, the Pre-Flow GaN film had a significantly lower carrier concentration, consistent with a higher resistivity. In addition, the AFM data and images revealed that the semi-insulating Ga-polar GaN film made using Pre-Flow method has superior morphology (FIGS. 4A and 4B).

Example 2: Delayed Propane Flow

This Example demonstrates carbon-doped semi-insulating N-polar GaN on a sapphire substrate using propane precursor by controlling the growth rate of N-polar GaN during coalescence to improve carbon incorporation efficiency, providing a semi-insulating behavior. The data shown that the material quality and surface roughness of the N-polar GaN improved with the Delayed-Doping method. C-doping using 1.8 mmol/min of propane gave an abrupt doping profile that was useful for obtaining semi-insulating N-polar GaN grown on sapphire.

Propane was used as a carbon dopant precursor for obtaining the semi-insulating N-polar GaN layer on a miscut sapphire substrate using a vertical MOCVD reactor. The incorporation efficiency of carbon was improved in the N-polar GaN epitaxial layer using optimized growth conditions.

Experiment

Propane-doped N-polar GaN was grown on a miscut sapphire sample using the MOCVD growth technique. Trimethylgallium (TMGa) and ammonia ($NH_3$) were used as group-III precursors and group-V precursors, respectively. Propane was used as a carbon (C) dopant source and $H_2$ was used as a carrier gas. The miscut sapphire sample was heated at 1300° C. and nitridation was performed prior to the deposition of a high-temperature (1145° C.) nucleation layer at 100 mbar reactor chamber pressure, and a V/III ratio of ~8000, using similar growth conditions as described by Keller et al. [Keller, Stacia et al., Semiconductor Science and Technology 29, no. 11 (Nov. 1, 2014): 113001.] The temperature was increased to 1270° C. for the coalescence and then sustained growth of a 1.8 μm thick high temperature (HT) N-polar GaN layer. However, for all the experiments, introduction of the propane was delayed until the GaN coalescence layer had reached a thickness of 50 nm.

Two different growth conditions were used for the propane doping experiments, where the TMGa molar flow was varied for the observation of the propane incorporation. For the first growth condition ($G_1$), 137 μmol/min TMGa was used with different propane concentrations of 0 mmol/min to 3.6 mmol/min. The second growth condition ($G_2$) had a TMGa molar flow of 204 μmol/min, and propane concentration varied from 0 mmol/min to 2.4 mmol/min. The V/III ratio was kept constant for both $G_1$ and $G_2$. Table 2 shows the growth conditions and corresponding propane concentrations used for $G_1$ and $G_2$.

The background electron concentration of all the samples was measured by Hall measurement using Van-Der-Pauw geometry. The omega-rocking curve was measured using the Panalytical Empyrean high-resolution X-ray diffraction (XRD) tool with a ½° slit and open detector condition for analyzing material quality. The surface roughness of the grown samples was measured using an atomic force microscope (AFM) Bruker Icon. Secondary ion-mass spectroscopy (SIMS) measurement was done using a Cameca instrument, at a beam condition of 14.5 KeV and 25 nA for observing $O_2$ and C concentration in the samples using $Cs^+$ ions. All the samples showed hillock-free atomically smooth surfaces under a Normarski optical microscope.

TABLE 2

Different growth conditions along with the propane flowrate for the growth of N-polar GaN.

| Growth Condition | TMGa flow rate (μmol/min) | Propane flow rate (mmol/min) |
|---|---|---|
| $G_1$ | 137 | 0 |
| | | 1.2 |
| | | 2.4 |
| | | 3.6 |
| $G_2$ | 204 | 0 |
| | | 0.6 |
| | | 1.2 |
| | | 1.4 |
| | | 1.8 |
| | | 2.4 |

Results and Discussion

Figure 5B:
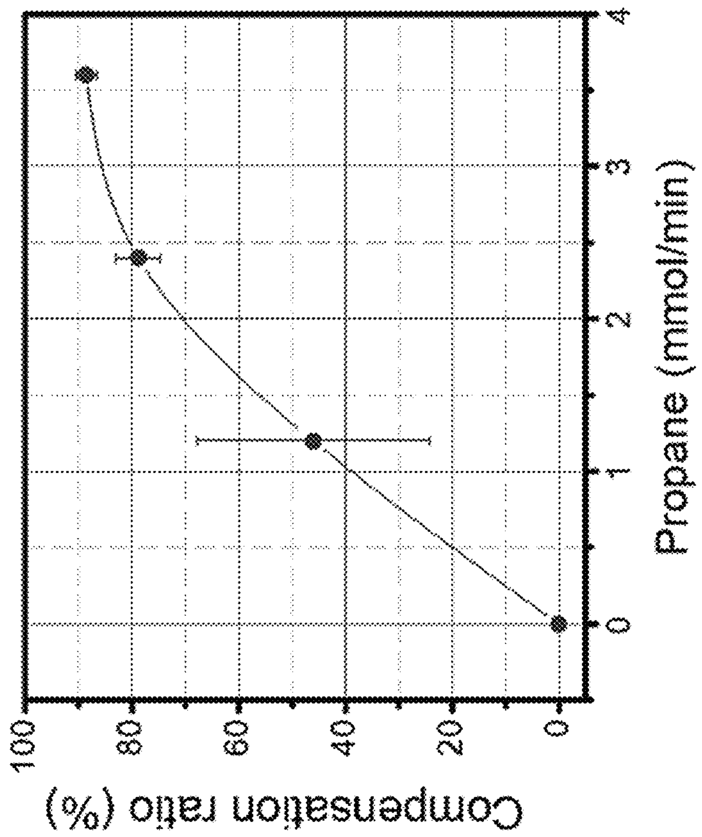
FIG. 5A shows background carrier concentration and FIG. 5B shows compensation ratio of N-polar GaN with the different propane flow rate.
Figure 5A:
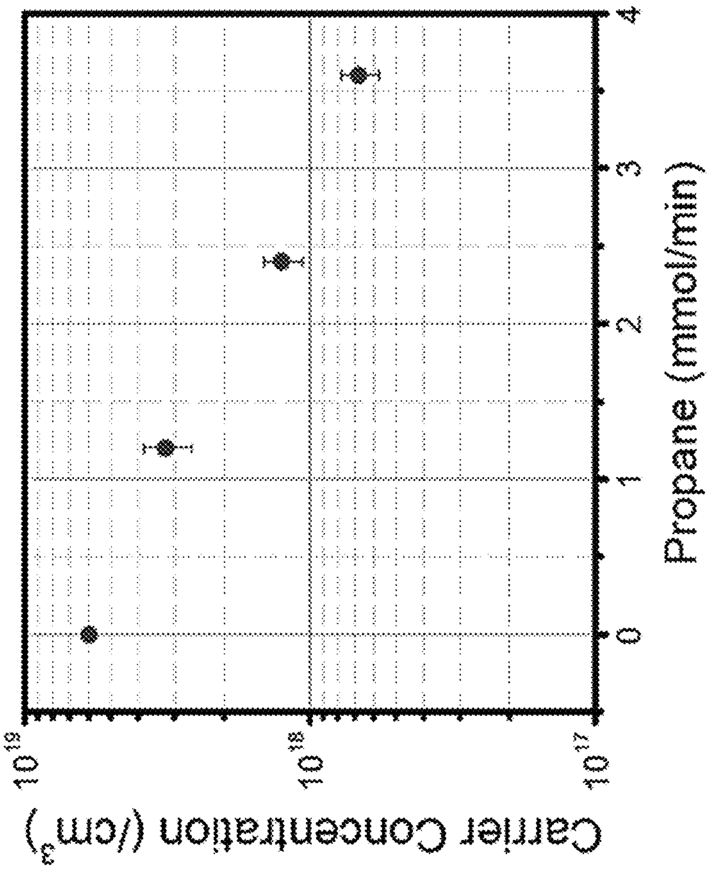

The carbon incorporation efficiency was observed primarily using Hall measurements. The first growth condition ($G_1$) with a TMGa flow rate of 137 μmol/min showed exponential decay in the background carrier concentration with an increasing propane flow rate (FIG. 5A). It has been observed in the literature that the carbon concentration in Ga-polar GaN linearly depends on the propane flow rate. (Lesnik, A. et al., Phys. Status Solidi B, 254: 1600708.) So, it is expected that with increased propane flow, the background carrier concentration should decrease and the compensation ratio $$\left(CR = \frac{n_{UID} - n_{C\text{-}doped}}{n_{UID}} \times 100\right)$$

should increase linearly. It was also determined from the present experiment in N-polar GaN that the CR follows almost a linear profile with the propane flow rate (FIG. 5A). At a very high propane flow rate, there was a small deviation of the CR from the linearity (FIG. 5B). This might be related to the increased dislocation density, which was observed in FIG. 6. The increase in dislocation density can increase the background O incorporation, as observed by Szymanski et. al [Semiconductor Science and Technology 37, no. 1 (Jan. 1, 2022): 015005.].

Figure 6:
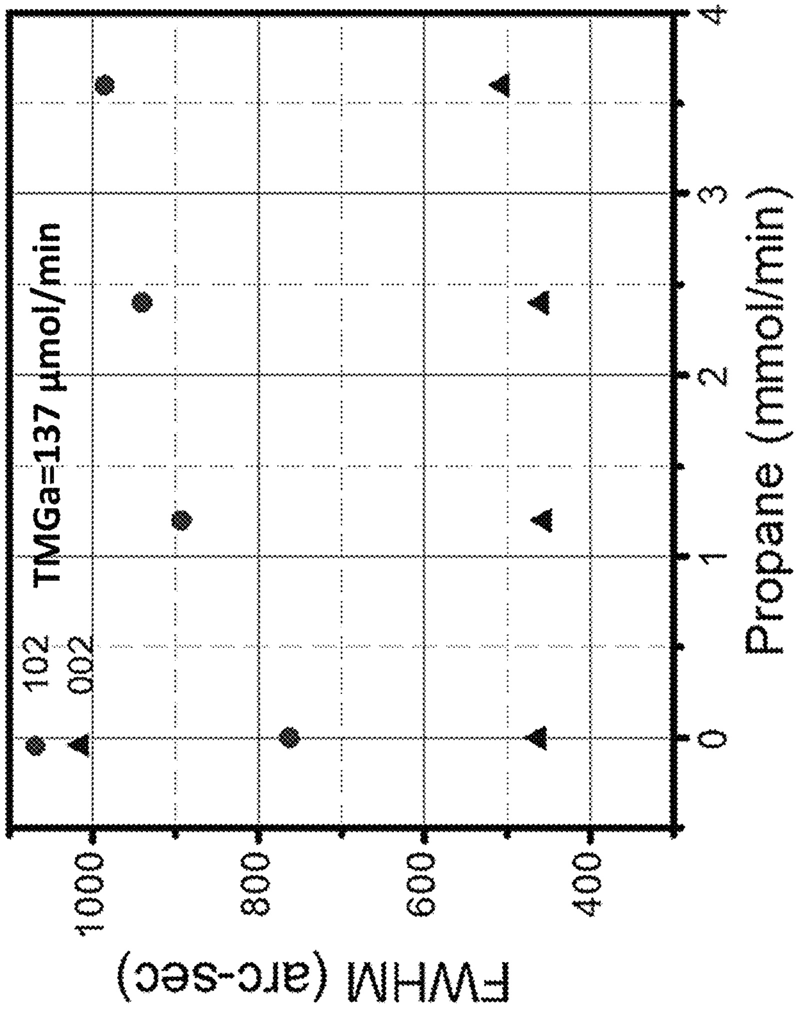
FIG. 6 shows full-width half maxima (FWHM) of the omega-rocking curve, measured using HRXRD on propane-doped N-polar GaN samples grown using $G_1$ growth condition.

Omega-rocking curve measurement indicated that with increasing propane flow rate, the off-axis (102) full-width half maxima (FWHM) increased, suggesting increased edge dislocation density (FIG. 6). The on-axis (002) FWHM remained the same. The surface roughness appeared to be more or less similar with increasing propane flow rate (FIGS. 7A-7D), which shows that the step-flow was not affected by increased propane flow. The RMS roughness of these propane-doped N-polar GaN samples was found to be less than 1.5 nm. Next, in the $G_2$ series of growths, an optimized growth condition was used to increase C-incorporation efficiency, such that even with the use of a lower amount of propane, semi-insulating behavior can be obtained.

Figure 8:
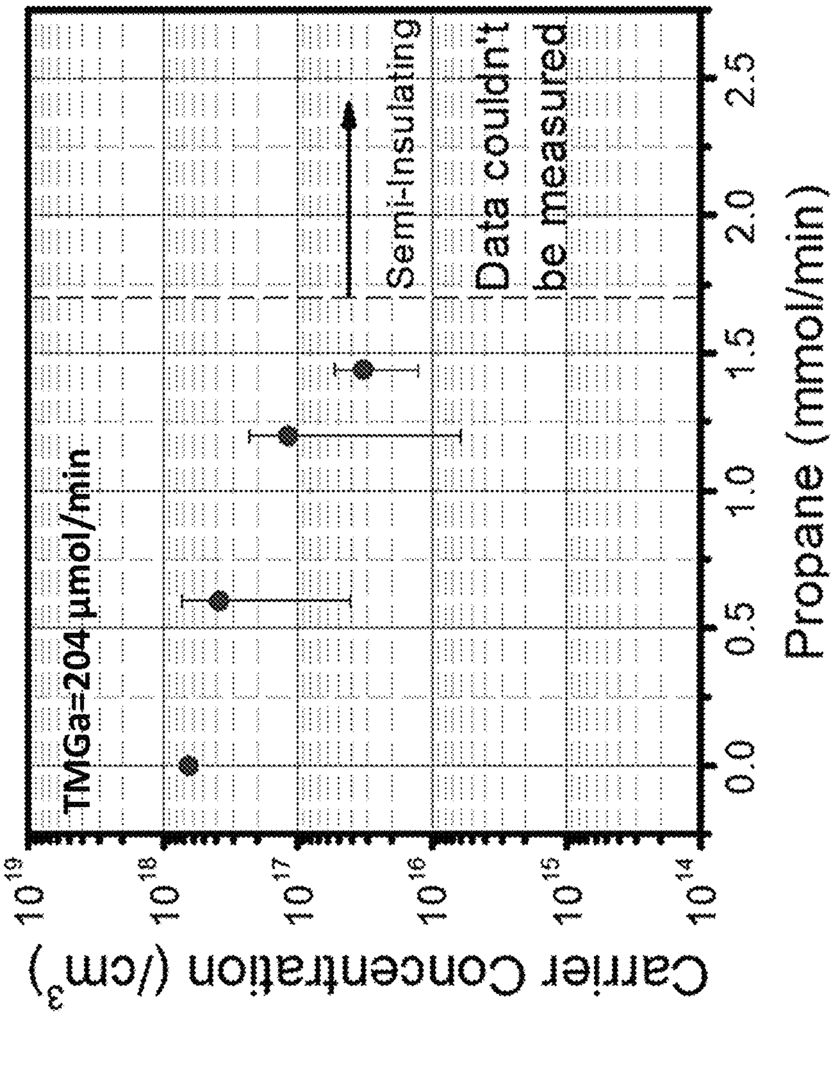
FIG. 8 shows background carrier concentration of N-polar GaN using a $G_2$ growth condition (see Examples) with the different propane flow rates.

For improving the incorporation of carbon using a propane precursor, the $G_2$ growth condition was used for the following studies. Increasing the TMGa flow rate from 137 μmol/min to 204 μmol/min increased the growth rate from 60 nm/min to 90 nm/min and showed not only higher propane incorporation but reduced background carrier concentration. This might be related to trapping of more carbon atoms during the growth while limiting C desorption and fewer chances for $O_2$ incorporation due to the higher supersaturation condition. Hall measurements showed semi-insulating behavior with propane concentration>1.8 mmol/min (FIG. 8). An exponential decay in background carrier concentration was observed with monotonically increasing propane flow.

Figure 9:
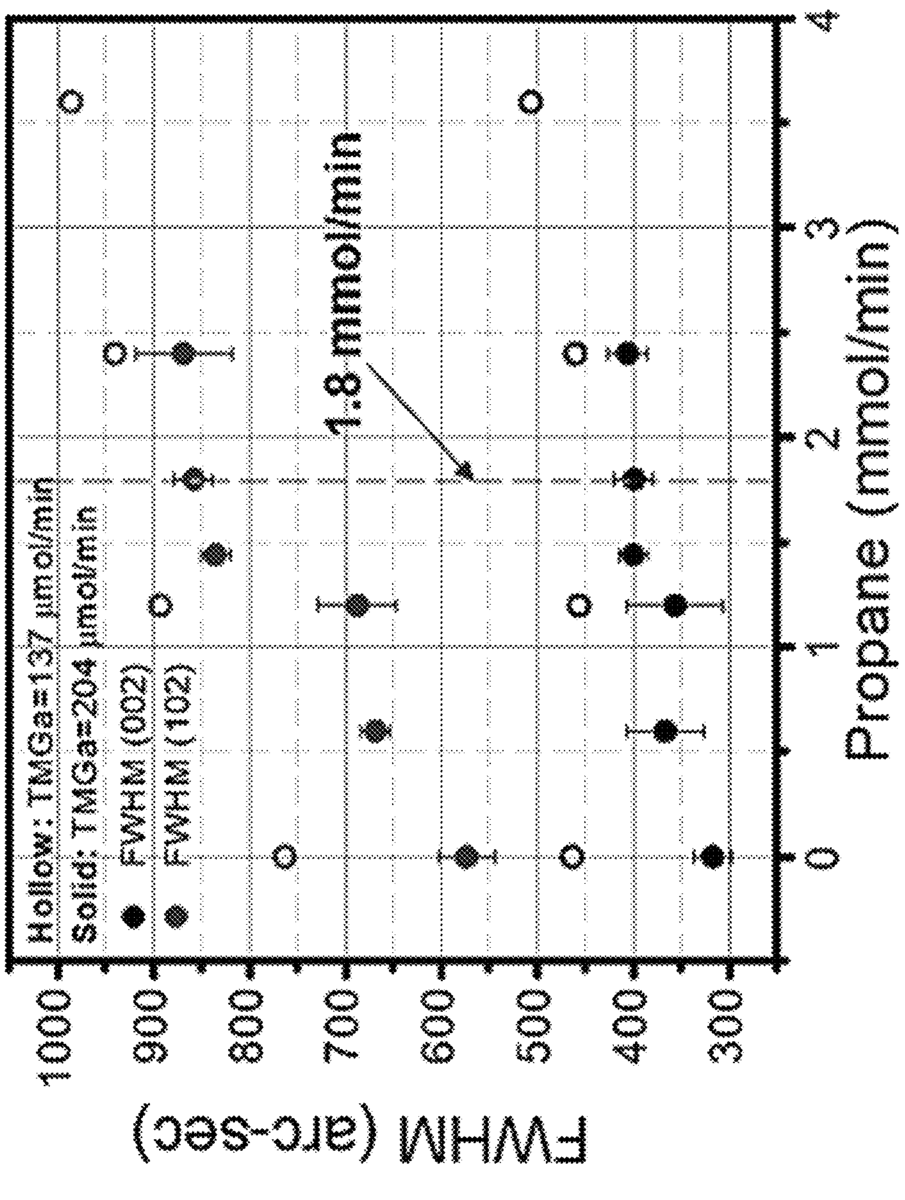
FIG. 9 shows FWHM of the omega-rocking curve, measured using HRXRD on propane-doped N-polar GaN samples grown using $G_1$ and $G_2$ growth condition.

The omega-rocking curve measurement on the $G_2$ sample showed similar trends as $G_1$ (FIG. 9). The FWHM increased with increasing propane flow rate. Although it followed a comparable trend, it exhibited notably lower FWHM values in contrast to $G_1$, demonstrating a reduced dislocation density in comparison to $G_1$. Implementation of the modified growth condition $G_2$ assisted in achieving semi-insulating N-polar GaN material while utilizing a decreased propane flow rate. It improved the material's crystalline quality while reducing the background carrier concentration, indicating that the compensation of $O_2$ mainly occurred due to the increased incorporation efficiency of CN atoms and not due to the increase of dislocation and defect density. The FWHM of the semi-insulating C-doped N-polar GaN was still higher than N-polar unintentionally doped (UID) GaN.

Figures 10A, 10B:
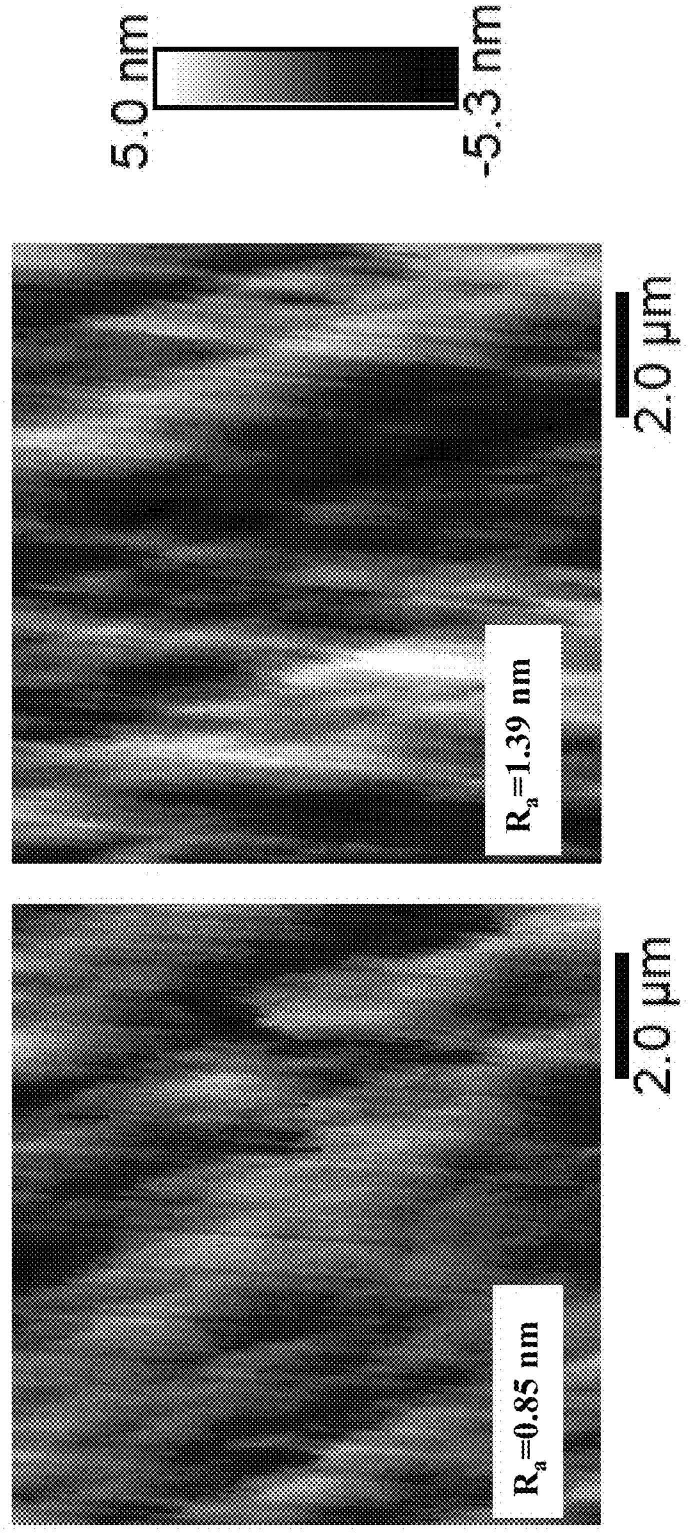
FIGS. 10A-10B show AFM scans (10 μm×10 μm) of N-polar GaN sample growth using $G_2$ growth condition with propane concentration of (FIG. 10A) 1.8 mmol/min, (FIG. 10B) 2.4 mmol/min.

The surface roughness remained below 1.5 nm for the 10 μm×10 μm AFM scan area, depicting device quality C-doped, semi-insulating, N-polar GaN samples using propane flow rates of 1.8 mmol/min and 2.4 mmol/min (FIGS. 10A-10B).

Figure 11:
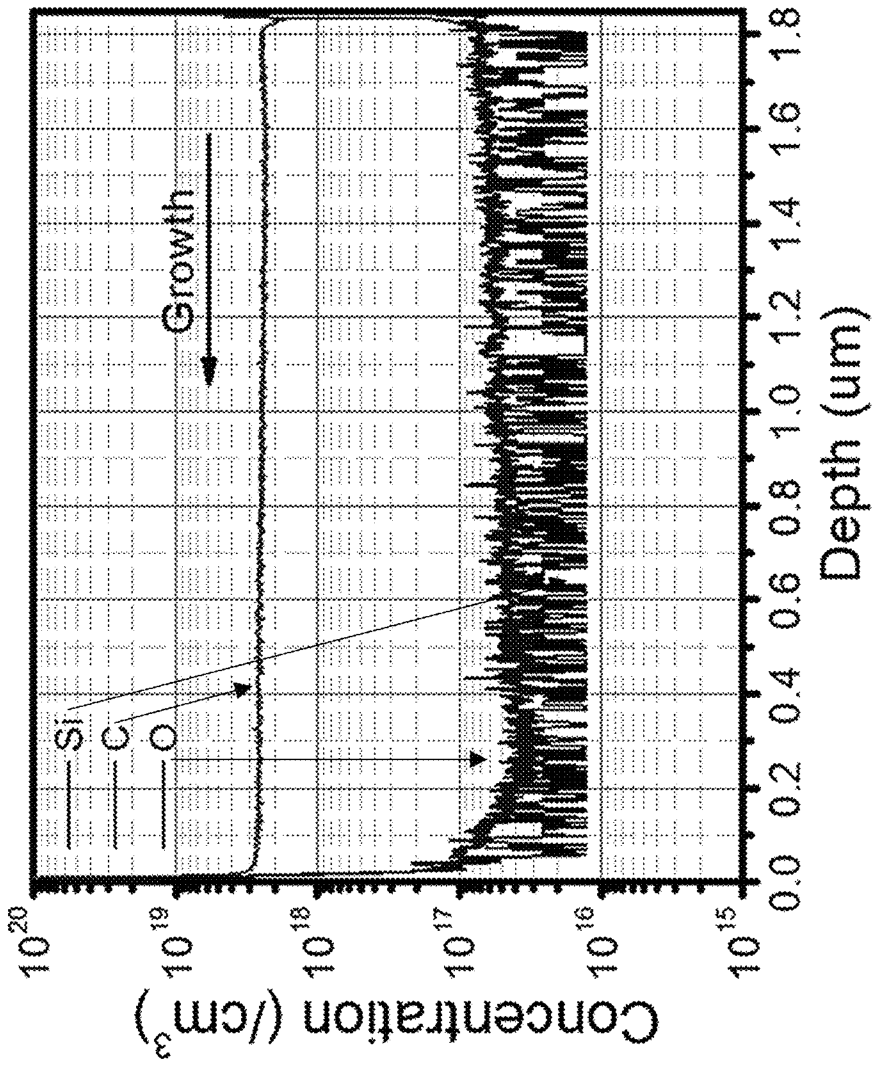
FIG. 11 shows SIMS measurement of propane-doped N-polar GaN sample with a propane flowrate of 2.4 mmol/min and growth condition $G_2$.

The SIMS measurement from the $G_2$ growth condition using 2.4 mmol/min propane flow showed more than one order of magnitude higher C-concentration compared to the $O_2$ and Si impurity level, demonstrating complete semi-insulating behavior (FIG. 11). The detection levels of $O_2$, C, and Si were $10^{16}/cm^3$, $5\times10^{16}/cm^3$ and $10^{16}/cm^3$, respectively. In order to compensate for the increased background O at the N-polar GaN/sapphire interface, the C concentration needs to be significantly high near the interface. The increased O needs to be fully compensated by the C or the region near the interface needs to be fully depleted to obtain the semi-insulating property of N-polar GaN. It would be possible to achieve a semi-insulating property if the C concentration is sufficiently higher than the increased O concentration. One of the possible reasons for obtaining semi-insulating behavior might be due to a more than one order of magnitude higher C concentration compared to the O concentration in the bulk N-polar GaN. This higher C concentration might be sufficient to fully compensate for the increased O level at the interface. Another possible reason might be that the higher O level is near the nucleation layer and it is not fully electrically conductive. In the nucleation layer, the N-polar GaN film quality might not be as good as the bulk, which appears from the thin island growth method in the nucleation layer [Keller, Stacia et al., Semiconductor Science and Technology 29, no. 11 (Nov. 1, 2014): 113001]. So, even though the O concentration is higher near the interface it will not act like a fully conductive path. However, the resolution of the SIMS measurement tool is insufficient to capture the thickness (possibly less than 50 nm) of the N-polar GaN/sapphire interface where elevated O levels might exist.

Unless otherwise indicated, measured and measurable quantities recited herein refer to said quantities at room temperature (23° C.) and atmospheric pressure.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean only one or can mean "one or more." Embodiments of the inventions consistent with either construction are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semi-insulating, extrinsically carbon-doped, N-polar gallium nitride-containing structure comprising:

a substrate; and a layer of semi-insulating, extrinsically carbon-doped N-polar gallium nitride on a surface of the substrate, the layer of extrinsically carbon-doped N-polar gallium nitride having a carbon dopant concentration of at least $1\times10^{17}$ cm$^{-3}$, an electron concentration of no greater than $1\times10^{15}$ cm$^{-3}$, a sheet resistance of at least 100 kΩ/sq, and a thickness in the range from 1 μm to 10 μm.

2. The semi-insulating, extrinsically carbon-doped N-polar gallium nitride-containing structure of claim 1, wherein the carbon dopant concentration of at least $1\times10^{17}$ cm$^{-3}$ extends through the entire thickness of the semi-insulating, extrinsically carbon-doped N-polar gallium nitride layer, including an N-polar gallium nitride nucleation layer at the surface of the substrate.

3. The semi-insulating, extrinsically carbon-doped N-polar gallium nitride-containing structure of claim 1, having an RMS surface roughness over a surface area of at least 2 μm×2 μm of no greater than 1.0 nm, as measured by atomic force microscopy.

4. The semi-insulating, extrinsically carbon-doped N-polar gallium nitride-containing structure of claim 1, wherein the substrate is a sapphire substrate.

5. The semi-insulating, extrinsically carbon-doped N-polar gallium nitride-containing structure of claim 1, wherein the layer of extrinsically carbon-doped N-polar gallium nitride has a sheet resistance of at least 1 MΩ/sq.

6. The semi-insulating, extrinsically carbon-doped N-polar gallium nitride-containing structure of claim 1, wherein the layer of extrinsically carbon-doped N-polar gallium nitride has a carbon dopant concentration in the range from $1\times10^{17}$ cm$^{-3}$ to $1\times10^{20}$ cm$^{-3}$.

7. The semi-insulating, extrinsically carbon-doped N-polar gallium nitride-containing structure of claim 1, wherein the layer of extrinsically carbon-doped N-polar gallium nitride has an electron concentration of less than $1\times10^{14}$ cm$^{-3}$.

8. The semi-insulating, extrinsically carbon-doped N-polar gallium nitride-containing structure of claim 5, wherein the layer of extrinsically carbon-doped N-polar gallium nitride has a carbon dopant concentration in the range from $1\times10^{17}$ cm$^{-3}$ to $1\times10^{20}$ cm$^{-3}$.

9. A semi-insulating, extrinsically carbon-doped gallium nitride-containing structure comprising:

a substrate having a surface; and a layer of semi-insulating, extrinsically carbon-doped gallium nitride on the surface of the substrate, the layer of semi-insulating, extrinsically carbon-doped gallium nitride having a carbon dopant concentration of at least $1\times10^{17}$ cm$^{-3}$, an electron concentration of no greater than $1\times10^{15}$ cm$^{3}$, and a sheet resistance of at least 100 kΩ/sq, wherein the layer of semi-insulating, extrinsically carbon-doped gallium nitride includes: a sub-layer of gallium nitride that is free of extrinsic carbon dopant atoms and having a thickness of greater than 10 nm on the surface of the substrate; and an overlayer of the extrinsically carbon-doped gallium nitride layer on the sub-layer of gallium nitride.

10. The semi-insulating, extrinsically carbon-doped gallium nitride-containing structure of claim 9, wherein the substrate is a sapphire substrate.

11. The semi-insulating, extrinsically carbon-doped gallium nitride-containing structure of claim 9, wherein the gallium nitride is N-polar gallium nitride.

12. The semi-insulating, extrinsically carbon-doped gallium nitride-containing structure of claim 9, wherein the gallium nitride is Ga-polar gallium nitride.

13. The semi-insulating, extrinsically carbon-doped gallium nitride-containing structure of claim 9, wherein the sub-layer of gallium nitride has a thickness in the range from 10 nm to 500 nm.

14. The semi-insulating, extrinsically carbon-doped gallium nitride-containing structure of claim 9, wherein the sub-layer of gallium nitride has a thickness in the range from 10 nm to 100 nm.

15. The semi-insulating, extrinsically carbon-doped gallium nitride-containing structure of claim 9, wherein the layer of extrinsically carbon-doped gallium nitride has a sheet resistance of at least 1 MΩ/sq.

16. The semi-insulating, extrinsically carbon-doped gallium nitride-containing structure of claim 9, wherein the layer of extrinsically carbon-doped gallium nitride has a carbon dopant concentration in the range from $1\times10^{17}$ cm$^{-3}$ to $1\times10^{20}$ cm$^{-3}$.

17. The semi-insulating, extrinsically carbon-doped N-polar gallium nitride-containing structure of claim 9, wherein the layer of extrinsically carbon-doped gallium nitride has an electron concentration of less than $1\times10^{14}$ cm$^{-3}$.

18. The semi-insulating, extrinsically carbon-doped gallium nitride-containing structure of claim 11, wherein the layer of extrinsically carbon-doped N-polar gallium nitride has a carbon dopant concentration in the range from $1\times10^{17}$ cm$^{-3}$ to $1\times10^{20}$ cm$^{-3}$.

* * * * *